(12) United States Patent
Ribeiro et al.

(10) Patent No.: US 9,331,700 B2
(45) Date of Patent: May 3, 2016

(54) METAL-INSULATOR PHASE TRANSITION FLIP-FLOP

(75) Inventors: Gilberto M. Ribeiro, Palo Alto, CA (US); Matthew D. Pickett, San Francisco, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 14/345,594

(22) PCT Filed: Oct. 28, 2011

(86) PCT No.: PCT/US2011/058461
§ 371 (c)(1),
(2), (4) Date: Mar. 18, 2014

(87) PCT Pub. No.: WO2013/062595
PCT Pub. Date: May 2, 2013

(65) Prior Publication Data
US 2014/0313818 A1 Oct. 23, 2014

(51) Int. Cl.
*G11C 11/00* (2006.01)
*G11C 11/41* (2006.01)
*H01L 47/00* (2006.01)
(Continued)

(52) U.S. Cl.
CPC .......... *H03K 19/1776* (2013.01); *G11C 11/41* (2013.01); *G11C 13/0007* (2013.01); *G11C 19/28* (2013.01); *H01L 45/04* (2013.01); *H01L 45/1233* (2013.01); *H01L 45/146* (2013.01); *H03K 3/037* (2013.01); *H03K 3/357* (2013.01); *H03K 19/00315* (2013.01); *G11C 2013/0073* (2013.01); *G11C 2213/15* (2013.01); *G11C 2213/32* (2013.01)

(58) Field of Classification Search
CPC .......... G11C 13/0007; G11C 2213/15; G11C 2013/0073; H01L 14/04
USPC .......................................... 365/154, 159, 148
See application file for complete search history.

(56) References Cited

U.S. PATENT DOCUMENTS

| 3,670,313 A | 6/1972 | Beausoleil et al. |
| 3,708,690 A | 1/1973 | Paivinen |

(Continued)

FOREIGN PATENT DOCUMENTS

| CN | 101336447 | 12/2008 |
| CN | 101673804 | 3/2010 |

(Continued)

OTHER PUBLICATIONS

Boriskov, P.P. et al., Metal-insulator Transition in Electric Field: a Viewpoint from the Switching Effect, Feb. 28, 2006.

(Continued)

*Primary Examiner* — Ly D Pham
(74) *Attorney, Agent, or Firm* — North Shore Associates

(57) ABSTRACT

A metal-insulator phase transition (MIT) flip-flop employs a selected one of a pair of bi-stable operating states to represent a logic state of the MIT flip-flop. The MIT flip-flop includes an MIT device having a current-controlled negative differential resistance (CC-NDR) to provide the pair of bi-stable operating states. A bi-stable operating state of the pair is capable of being selected by a programing voltage. Once the bi-stable operating state is selected, the bi-stable operating state is capable of being maintained by a bias voltage applied to the MIT device.

20 Claims, 4 Drawing Sheets

(51) Int. Cl.

| | | |
|---|---|---|
| H01L 27/24 | (2006.01) | |
| H01L 27/26 | (2006.01) | |
| H03K 19/177 | (2006.01) | |
| G11C 19/28 | (2006.01) | |
| H03K 3/357 | (2006.01) | |
| H01L 45/00 | (2006.01) | |
| H03K 3/037 | (2006.01) | |
| H03K 19/003 | (2006.01) | |
| G11C 13/00 | (2006.01) | |

(56) References Cited

U.S. PATENT DOCUMENTS

| | | |
|---|---|---|
| 3,760,382 A | 9/1973 | Itoh |
| 3,797,002 A | 3/1974 | Brown |
| 3,812,336 A | 5/1974 | Bossen et al. |
| 3,893,088 A | 7/1975 | Bell |
| 4,037,205 A | 7/1977 | Edelberg et al. |
| 4,133,043 A | 1/1979 | Hiroshima et al. |
| 4,322,635 A | 3/1982 | Redwine |
| 4,521,874 A | 6/1985 | Rau et al. |
| 4,532,606 A | 7/1985 | Phelps |
| 4,845,670 A | 7/1989 | Nishimoto et al. |
| 4,903,240 A | 2/1990 | Von Flue |
| 5,153,846 A | 10/1992 | Rao |
| 5,299,156 A | 3/1994 | Jiang et al. |
| 5,313,433 A | 5/1994 | Waller |
| 5,504,919 A | 4/1996 | Lee et al. |
| 5,543,748 A | 8/1996 | Ando |
| 5,677,864 A | 10/1997 | Chung |
| 5,698,997 A | 12/1997 | Williamson et al. |
| 5,930,323 A | 7/1999 | Tang et al. |
| 6,021,075 A | 2/2000 | Yoshinori |
| 6,061,417 A | 5/2000 | Kelem |
| 6,239,638 B1 | 5/2001 | Masuda |
| 6,362,660 B1 | 3/2002 | Deng |
| 6,745,216 B1 | 6/2004 | Nakamura |
| 6,834,005 B1 | 12/2004 | Parkin |
| 7,051,153 B1 | 5/2006 | Lin et al. |
| 7,508,701 B1 | 3/2009 | Liang et al. |
| 7,573,310 B2 | 8/2009 | Yang et al. |
| 7,608,849 B2 | 10/2009 | Ino et al. |
| 7,728,327 B2 | 6/2010 | Kim et al. |
| 7,791,376 B2 | 9/2010 | Lim et al. |
| 7,983,068 B2 | 7/2011 | Ufert |
| 2002/0089024 A1 | 7/2002 | Iwata |
| 2004/0027863 A1 | 2/2004 | Lee et al. |
| 2004/0201010 A1* | 10/2004 | Ugajin ............................ 257/25 |
| 2004/0239606 A1 | 12/2004 | Ota |
| 2005/0127524 A1 | 6/2005 | Sakamoto et al. |
| 2005/0138501 A1 | 6/2005 | Motika et al. |
| 2007/0080345 A1 | 4/2007 | Joo et al. |
| 2007/0165446 A1 | 7/2007 | Oliva et al. |
| 2007/0211531 A1 | 9/2007 | Atti et al. |
| 2007/0262408 A1* | 11/2007 | Takagi et al. ................. 257/467 |
| 2007/0267627 A1 | 11/2007 | Joo et al. |
| 2009/0294869 A1 | 12/2009 | Chen |
| 2010/0141322 A1 | 6/2010 | Chua-Eoan |
| 2010/0193824 A1 | 8/2010 | Kim et al. |
| 2011/0106742 A1 | 5/2011 | Pino |
| 2012/0104346 A1* | 5/2012 | Yi et al. ............................. 257/4 |
| 2012/0138885 A1 | 6/2012 | Wu et al. |
| 2013/0048950 A1* | 2/2013 | Levy et al. ....................... 257/29 |
| 2013/0106480 A1* | 5/2013 | Ribeiro et al. ................ 327/192 |

FOREIGN PATENT DOCUMENTS

| | | |
|---|---|---|
| EP | 0237337 A2 | 9/1987 |
| EP | 0827156 | 4/1998 |
| EP | 1617482 A2 | 1/2006 |
| JP | 2005071500 | 3/2005 |
| KR | 1020060006195 | 1/2006 |

OTHER PUBLICATIONS

Chen, F. et al., S-shaped Negative Differential Resistance Modeling in Electro-thermal Simulation of Phase-change Memory Programming, Non-Volatile Memory Technology Symposium, Nov. 10-13, 2007, pp. 67-70, Albuquerque.

Lee et al., "High-Speed Median Filter Designs Using Shiftable Content-Addressable Memory," IEEE Trans. Circuits and Systems for Video Tech., vol. 4, No. 6, Dec. 1994, pp. 544-549.

Chudnovskii, F.A. et al., Switching Phenomena in Chromium-doped Vanadium Sesquioxide, Journal of Applied Physics, Sep. 1, 1998, pp. 2643-2646, vol. 84, No. 5.

Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.

Hikita, Y. et al., Negative Differential Resistance Induced by Mn Substitution at SrRuO3/Nb: SrTiO3 Schottky Interfaces, Journals of American Physical Society, Mar. 19, 2008, vol. 77, No. 20.

PCT Search Report, PCT/US2011/058461, May 31, 2012.

Pickett et al., "Coexistence of Memristance and Negative Differential Resistance in a Nanoscale Metal-Oxide-Metal System," IEEE Advanced Materials, 2011, pp. 23, 1730-1733.

Perez-Andrade, R. et al., "A Versatile Linear Insertion Sorter Based on a FIFO Scheme," IEEE Computer Society Annual Symposium on VLSI, 2008, pp. 357-362.

Youn, D.H. et al., Observation of Abrupt Metallic Transitions in p-Type GaAs Devices and Comparison with Avalanche Breakdown in the InGaAs APD, Journal of the Korean Physical Society, Jul. 1, 2005, pp. 1-5, vol. 47, No. 1.

Supplementary European Search Report, Mar. 5, 2015, European Patent Application No. 11874593.4, 3 pages.

Bender et al., Insertion Sort is O (n log n), In Proceedings of the Third International Conference on FunWith Algorithms (FUN), 2004 (6 pages).

European Patent Office, Extended EP Search Report, Application No: 11868835.7-1805 dated Feb. 3, 2015 (8 pages).

Han et al., Integer Sorting in $(n \sqrt{\log \log n})$ Expected Time and Linear Space, 2002 (10 pages).

Mikkel Thorup, Chapter 1—On RAM priority queues, 1996 (9 pages).

PCT Search Report/Written Opinion~Application No: PCT/US2011/042223 dated Jan. 2, 2012~8 pages.

Stephen C. Johnson, Algorithms for the 21st century presented at the 2006 USENIX Annual Technical Conference, Boston, MA, vol. 31, No. 5 (7 pages).

The Austin Group, Draft Standard for Information Technology—Portable Operating System Interface (POSIX), IEEE P1003.1, Draft 6, Apr. 2001/Open Group Technical Standard, Issue 6, 23 pages.

* cited by examiner

METAL-INSULATOR PHASE TRANSITION FLIP-FLOP

CROSS-REFERENCE TO RELATED APPLICATIONS

N/A

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory, and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1:
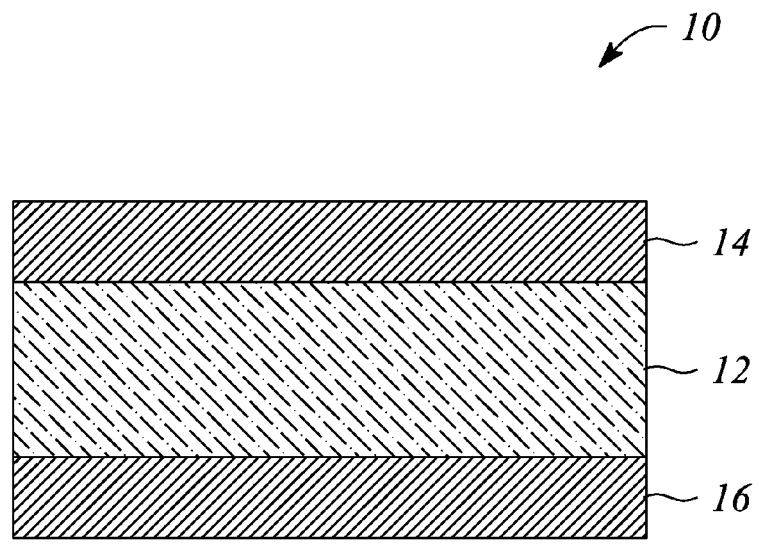
FIG. 1 illustrates a simplified cross sectional view of a metal-insulator phase transition device, according to an example of the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide a flip-flop based on a negative differential resistance (NDR) associated with a metal-insulator phase transition (MIT). In particular, current-controlled (CC) NDR of an MIT device may provide a pair of bi-stable operating points or states, according to examples of the principles described herein. The CC-NDR-provided operating state bi-stability of the MIT device may be used to store information, according to various examples. In particular, the bi-stable operating states may represent logic states that are used to store the information. Further, according to some examples, the stored information may be subsequently forwarded or communicated to other devices. Storing and subsequent forwarding of information are principal characteristics of both a flip-flop and more generally, a memory cell. As such, the MIT device having CC-NDR to provide the bi-stable operating states that facilitate storing and forwarding information may be used to realize an MIT flip-flop, according to various examples. MIT flip-flops and MIT memory cells constructed from the MIT flip-flop are broadly applicable to a number of memory architectures including, but not limited to, shift registers and shiftable memory systems, for example.

Flip-flops, or related memory cells that share many operational characteristics with flip-flops, are an integral part of most modern computers and related processing systems. In particular, for example, flip-flops and memory cells may be found in virtually all CPUs, memory registers and cache (e.g., L1, L2, etc.). In addition, some main memory, most notably recently developed so-called 'shiftable memory,' may employ flip-flops or SRAM memory cells that operate as flip-flops, for example.

According to examples of the principles described herein, the MIT flip-flop and the MIT memory cell may provide relatively fast switching between the operating states (i.e., logic states) as well as low power consumption, and in some examples very low power consumption, when compared to other memory technologies. For example, an individual two-terminal MIT device employed in either of the MIT flip-flop or the MIT memory cell may have an overall size on the order of less than about 50 by 50 nanometers (nm) and may exhibit sub-nanosecond (ns) switching times. In addition, energy consumed by the MIT device to effect switching of the MIT device may be less than, and in some examples much less than, about 100 femtojoules, according to some examples. Further, example flip-flops that include the MIT device having CC-NDR may be readily integrated with conventional integrated circuits (ICs) that comprise one or more of group IV, group III-V and group II-VI semiconductors, according to some examples. For example, the MIT device may be fabricated using a back-end or surface-deposition additive process on a surface of a conventional IC. According to some examples, the MIT device-based flip-flops and memory cells described herein may be employed in conjunction with various complimentary metal-oxide semiconductor (CMOS) based circuits, memory systems, central processing units (CPUs), and various application specific ICs (ASICs).

FIG. 1 illustrates a simplified cross sectional view of a metal-insulator phase transition (MIT) device 10, according to an example of the principles described herein. The MIT device 10, as illustrated, is a two terminal device comprising a layer 12 disposed between a first or 'top' electrode 14 and a second or 'bottom' electrode 16. The layer 12 comprises a metal-insulator phase transition (MIT) material. As such, the layer 12 may be referred to as an 'MIT material layer' 12 or simply an 'MIT layer' 12. According to various examples, the first and second electrodes 14, 16 are conductors that facilitate applying both of a programming signal (e.g., a programming voltage) and a bias signal (e.g., a bias voltage) to the MIT material of the MIT material layer 12. The programming signal may be employed to set an operating state of the MIT device while the bias signal is used to maintain the operating state, once set, according to various examples.

In some examples, the MIT material layer 12 is a thin film layer having a thickness on the order of several tens of nanometers. For example, the MIT material of the MIT material layer 12 may have a thickness between about 10 nanometers (nm) to about 100 nm. In another example, the thin film MIT material of the MIT material layer 12 may be between about 20 nm and about 50 nm thick. In yet other examples, the MIT material of the MIT material layer 12 may be less than about 30 nm in overall thickness.

By definition herein, the MIT material is a material such as, but not limited to, a transition metal oxide that is capable of undergoing a phase transition from an insulator to a conductor within at least a portion of the material. Herein, a phase transition from an insulator to a conductor is referred to as an 'insulator-to-metal phase transition.' In some examples, the insulator-to-metal phase transition may result from or be due to Joule heating of the material that induces filamentary metallic phase formation, for example. Formation of the filamentary metallic phase may facilitate conduction of an electric current through what was otherwise an insulator. As such the metal-insulator phase transition may be temperature-driven, according to some examples. Joule heating may be field-induced or current-induced, according to various examples. A device comprising such a metal-insulator phase transition material (e.g., a transition metal oxide) may have or exhibit the aforementioned CC-NDR over at least a portion of a current-voltage (I-V) characteristic of the device, for example.

According to various examples, the MIT material of the MIT device 10 may be substantially any metal oxide or similar material that exhibits or is capable of exhibiting a current-controlled NDR associated with the metal-insulator phase transition. In particular, the MIT material of the MIT material layer 12 may comprise substantially any transition metal oxide that provides CC-NDR associated with a metal-insulator phase transition in at least a portion of the MIT material layer 12, according to some examples. For example, the MIT material may comprise an oxide of niobium. In another example, a titanium oxide may be used as the MIT material of MIT material layer 12. In other examples, oxides of tungsten, manganese, iron and vanadium as well as doped alloys thereof that may undergo an MIT transition may be employed as the MIT material of MIT material layer 12. Other metal oxides that may be employed include, but are not limited to, nickel oxide, nickel oxide doped with chromium, strontium titanium oxide, strontium titanium oxide doped with chromium, and various combinations of two or more thereof, for example.

In some examples, the MIT material of layer 12 may comprise a crystalline metal oxide. In some of these examples, the crystalline oxide may be mono-crystalline. In other examples, the MIT material of layer 12 comprises an amorphous metal oxide. In yet other examples, the MIT material of layer 12 comprises either a nanocrystalline oxide or a microcrystalline metal oxide. By definition herein, a nanocrystalline metal oxide is a metal oxide that includes or comprises a plurality of nano-scale crystallites having sizes of about 50 to 100 nm or less, while a microcrystalline oxide may include crystallites having sizes in the micron range (e.g., greater than about 100 nm), for example.

The first and second electrodes 14, 16 comprise a conductive material or conductor, according to various examples. For example, the first electrode 14 and the second electrode 16 may comprise a metal. The metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. According to various examples, other metals as well as other materials that are or may be rendered conductive (e.g., a highly doped semiconductors, conductive oxides, conductive nitrides, etc.) may be employed as the first electrode 14 and the second electrode 16. Moreover, in some examples, the conductive material of the first electrode 14 may be different than the conductive material of the second electrode 16. In other examples, the first and second electrodes 14, 16 comprise the same conductive material.

Additionally, the first and second electrodes 14, 16 may comprise more than one layer. For example, a layer of titanium may be employed between a platinum-based electrode and the metal oxide of the MIT material layer 12. In some examples, materials used in the electrodes 14, 16 may act as a diffusion barrier. For example, titanium nitride may be employed as a diffusion barrier. In some examples, a conductive material of one or both of the first and second electrodes 14, 16 may comprise the metal of a metal-oxide used as the MIT material layer 12. For example, one or both of the electrodes 14, 16 may comprise titanium when the MIT material layer 12 comprises titanium oxide. Similarly, one or both of the electrodes 14, 16 may comprise tantalum when the MIT material layer 12 comprises tantalum oxide. In yet other examples, a refractory material such as tungsten may be used for situations in which the electrode(s) 14, 16 may be exposed to very high temperatures (e.g., during manufacturing), for example.

According to some examples, the MIT device 10 may exhibit CC-NDR at certain bias levels when operated near or below certain temperatures (e.g., the 'certain temperatures' are at or above room temperature) that are dependent on a material of the MIT device. In particular, various MIT materials exhibit CC-NDR when cooled below a critical temperature. For example, cooling a titanium oxide-based MIT device to below about 155 kelvins (K) (about −118° Celsius)

(e.g., by immersing the MIT device in liquid helium or liquid nitrogen) may produce CC-NDR in the MIT device 10 over a range of bias levels. Other materials may exhibit CC-NDR at room temperature, or even higher, for example.

Negative differential resistance (NDR) is defined herein as a negative voltage-current relationship in a device. In particular, NDR is characterized by a decrease in voltage across the device as the current flowing through the device is increased. In contrast, a non-NDR device such as an 'ohmic' or conventional resistive device exhibits a positive voltage-current relationship. Namely, as the voltage across the device increases, current flowing through the device also always increases. Current-controlled NDR is defined herein as NDR that produces a current-voltage (I-V) characteristic of the MIT device that is a single-valued function of current, albeit possibly a multi-valued function of voltage, in an operational range of the MIT device.

Figure 2:
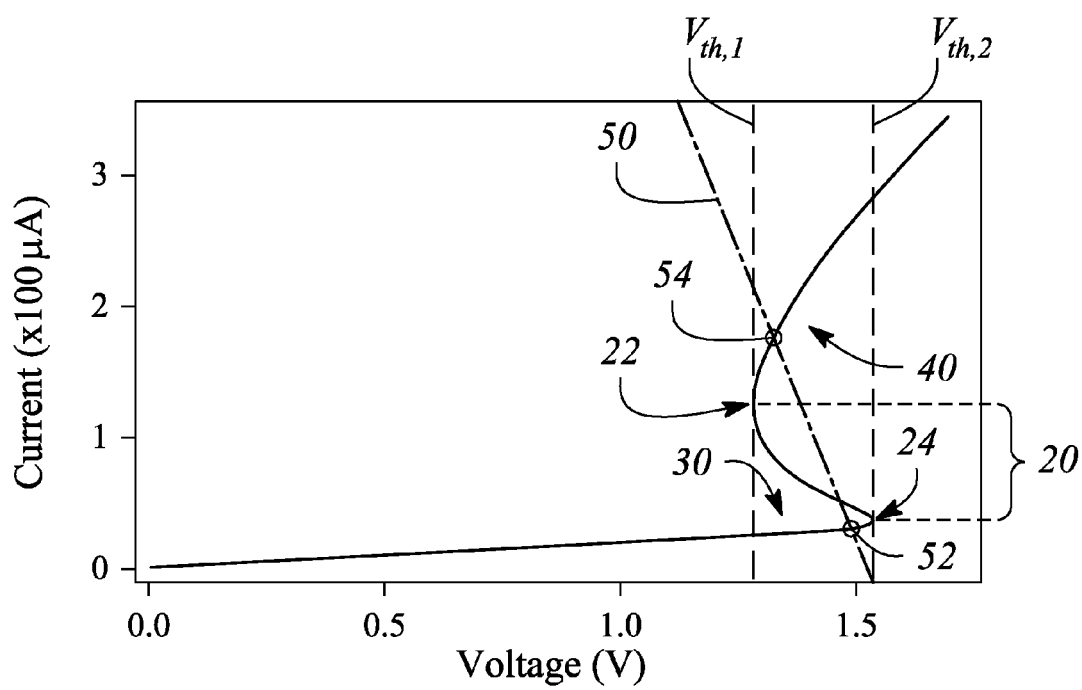
FIG. 2 illustrates a plot of a current-voltage (I-V) characteristic of a metal-insulator phase transition device exhibiting current-controlled negative differential resistance, according to an example of the principles described herein.

FIG. 2 illustrates a plot of a current-voltage (I-V) characteristic of a metal-insulator phase transition device exhibiting current-controlled negative differential resistance, according to an example of the principles described herein. The I-V characteristic plotted in FIG. 2 is meant to be illustrative of generally observed features of a typical I-V characteristic found in various two-terminal MIT devices. As illustrated, the MIT device I-V characteristic has a generally S-shaped profile with a region 20 in a middle portion of the S-shaped profile that represents a current-controlled negative differential resistance (CC-NDR) region of the MIT device I-V characteristic. The CC-NDR region 20 divides the I-V characteristic into a first operational region 30 located generally below the CC-NDR region 20 and a second operational region 40 located generally above the CC-NDR region 20. The first operational region 30 is typified by a relatively higher MIT device resistance while the second operational region 40 is characterized by a relatively lower MIT device resistance. Hence, the first operational region 30 may be referred to as a 'high resistance' region 30 of the I-V characteristic and the second operational region 40 may be referred to as a 'low resistance' region 40 of the I-V characteristic, for example. Further as illustrated, the I-V characteristic transitions from the CC-NDR region 20 to the second operational region 40 at a first knee 22 and further transitions from the CC-NDR region 20 to the first operational region 30 at a second knee 24. The first knee 22 corresponds to a first threshold voltage $V_{th,1}$ while the second knee 24 corresponds to a second threshold voltage $V_{th,2}$.

According to various examples, the MIT device exhibiting the I-V characteristic illustrated in FIG. 2 may be configured to operate in a stable manner either above or below the CC-NDR region 20 (i.e., within either of the first or the second operational regions 30, 40). In particular, if the MIT device is biased by a bias voltage $V_{bias}$ that is between the first threshold voltage $V_{th,1}$ and the second threshold voltage $V_{th,2}$, the MIT device will exhibit bi-stable operation in either of the two operational regions 30, 40, according to various examples. The ability to remain in both of the first region 30 and the second region 40 while the voltage across the device is held within the range $V_{th,1}<V<V_{th,2}$ provides the bi-stability of the MIT device operation. As such, the CC-NDR of the MIT device provides a pair of bi-stable operating states corresponding the bi-stable operation within the two operational regions 30, 40 when configured to be held within the voltage range of $V_{th,1}<V<V_{th,2}$.

Furthermore, operation in a particular one of the pair bi-stable operating states is selectable using a programming voltage. The programming voltage may be a voltage that is momentarily applied to the MIT device, according to some examples. Specifically, a particular one of the pair of bi-stable operating states may be selected by applying a programming voltage that is either below the first threshold voltage $V_{th,1}$ or above the second threshold voltage $V_{th,2}$, according to various examples. Once the programming voltage is removed and the bias voltage re-established, the MIT device will tend to return to and operate in the particular bi-stable operating state that was selected by the applied programming voltage.

For example, if the bias voltage $V_{bias}$ is provided by a voltage source in series with a bias resistor, the MIT device will be capable of operating at a pair of bi-stable operating points determined by the intersection a load line 50 and the MIT device I-V characteristic, as illustrated. A first stable operating point 52 of the pair may be located in the first operating region 30 and may represent a first one of the pair of bi-stable operating states of the MIT device, for example. Similarly, a second stable operating point 54 of the pair may be located in the second operating region 40 and may represent a second one of the pair of bi-stable operating states of the MIT device, for example. A slope of the load line 50 is related to a resistance of the bias resistor, as illustrated in FIG. 2.

In the example illustrated in FIG. 2, the first bi-stable operating state may be selected by applying a programming voltage to the MIT device that is less than the first threshold voltage $V_{th,1}$. Alternatively, the second bi-stable operating state may be selected by applying a programming voltage to the MIT device that is greater than the second threshold voltage $V_{th,2}$, for the illustrated example. In particular, when a programming voltage that is less than the first threshold voltage $V_{th,1}$ is applied to the MIT device, an operating point of the MIT device moves to a point on the I-V characteristic that corresponds to the applied programming voltage (i.e., moves below the first threshold voltage $V_{th,1}$). Subsequently, when the programming voltage is removed and the bias voltage $V_{bias}$ is re-established, the operating point of the MIT device moves to and settles at the first operating point 52. As long as the MIT device biased with the bias voltage $V_{bias}$, the MIT device will operate at the first operating point 52 in a substantially stable manner (i.e., the first bi-stable operating state will be maintained).

On the other hand, application of a programming voltage that is greater or above than the second threshold voltage $V_{th,2}$ will result in the operating point of the MIT device moving to a corresponding point on the I-V characteristic that is above the second threshold voltage $V_{th,2}$. Subsequent removal of the programming voltage and re-establishment of the bias voltage $V_{bias}$ will result in the MIT device operating point settling at the second operating point 54 illustrated in FIG. 2. The MIT device will then operate at the second operating point 54 to maintain the second bi-stable operating state as long as the voltage bias $V_{bias}$ is provided to the MIT device.

In another example (not illustrated), the bias voltage $V_{bias}$ between the first and second threshold voltages $V_{th,1}$, $V_{th,2}$ may be provided directly by a voltage source (e.g., without the bias resistor). In this example, a corresponding load line (not illustrated) may be substantially vertical. As described above, the bi-stable operating states of the MIT device are represented by a pair of intersection points between the substantially vertical load line and the I-V characteristic of the MIT device within respective ones of the two operating regions 30, 40. Accordingly, selection and operation in the bi-stable operating states in this example may be substantially similar to the description above involving the bias resistor and load line 50 in FIG. 2, according to various examples.

The bi-stable operating states of the MIT device also may be referred to as 'resistive states' as they represent distinct and different absolute resistances of the MIT device. Moreover, since the bi-stable operating states of the MIT device produced by the CC-NDR region 20 may be selectively established or programmed, each of the bi-stable operating states also may be generally referred to as a 'selectable resistance,' 'programmable resistance,' or a 'selectable/programmable resistance state' of the MIT device, by definition herein.

Further, as used herein, the article 'a' is intended to have its ordinary meaning in the patent arts, namely 'one or more'. For example, 'a metal-insulator phase transition (MIT) device' means one or more MIT devices and as such, 'the MIT device' explicitly means 'the MIT device(s)' herein. Also, any reference to 'top', 'bottom', 'upper', 'lower', 'up', 'down', 'front', back', 'left' or 'right' is not intended to be a limitation herein. Moreover, the term 'about' when applied to a value herein generally means within the tolerance range of the equipment used to produce the value, or in some examples, it means plus or minus 10%, or plus or minus 5%, or plus or minus 1%, unless otherwise expressly specified. Moreover, examples herein are intended to be illustrative only and are presented for discussion purposes and not by way of limitation.

Figure 3A:
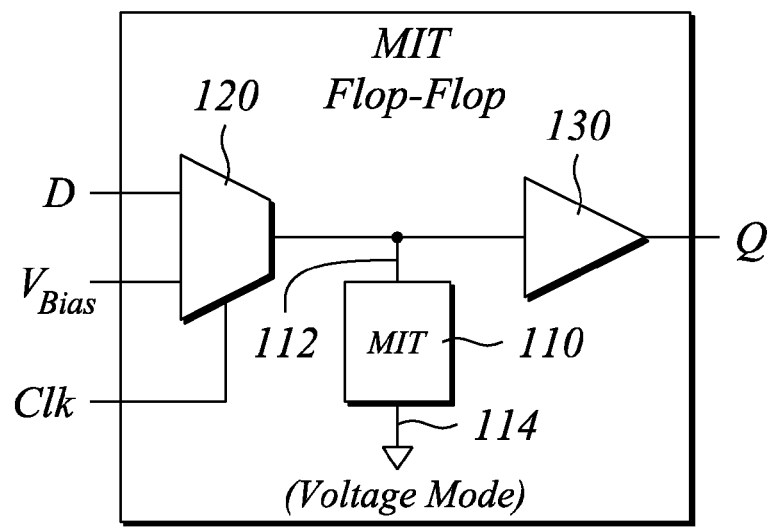
FIG. 3A illustrates a block diagram of a metal-insulator phase transition (MIT) flip-flop, according to an example of the principles described herein.
Figure 3B:
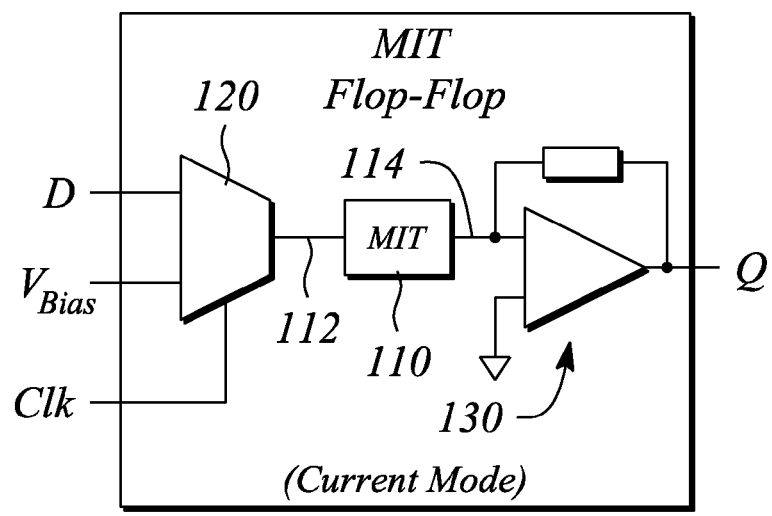
FIG. 3B illustrates a block diagram of a metal-insulator phase transition (MIT) flip-flop, according to another example of the principles described herein.

FIG. 3A illustrates a block diagram of a metal-insulator phase transition (MIT) flip-flop 100, according to an example of the principles described herein. FIG. 3B illustrates a block diagram of a metal-insulator phase transition (MIT) flip-flop 100, according to another example of the principles described herein. According to various examples, the MIT flip-flop 100 may function in a manner that is substantially similar to a data or D-type flip-flop (D flip-flop). In particular, the MIT flip-flop 100 stores a logic state or a data value of a signal at a data or input port D of the MIT flip-flop 100. The logic state of the input signal may be stored by the MIT flip-flop 100 as a bi-stable operating state of an element or elements (i.e., an MIT device) of the MIT flip-flop 100, for example. In some examples, a logic state of an output port Q of the MIT flip-flop 100 takes on or is set to correspond with the stored logic state of the MIT flip-flop 100. As with a D flip-flop, one or both of the stored logic state and the output port logic state of the MIT flip-flop 100 may be retained even when the input signal is removed or changes logic states. In various examples, the MIT flip-flop 100 may be configured to substantially mimic the functionality of any of several flip-flops including, but not limited to, a clocked D flip-flop and a master-slave or multiple stage D flip-flop.

In particular, in some examples, the MIT flip-flop 100 may be configured as a 'clocked' flip-flop to store (e.g., as the bi-stable operating state of an element) the logic state of the input signal that is present during a clock pulse $P_{clk}$ applied to the MIT flip-flop 100. For example, if the input signal at the input port D has a first logic state $S_1$ (e.g., a logic high) during at least a portion of the clock pulse $P_{clk}$, the logic state of the MIT flip-flop 100 may be set to a corresponding a first logic state $M_1$ (e.g., one of a logic high or a logic low), for example. After being set, the first logic state $M_1$ may be retained as the stored logic state of the MIT flip-flop 100 after the clock pulse $P_{clk}$ terminates. Furthermore, in the absence of the clock pulse $P_{clk}$, the first logic state $M_1$ may be retained by the MIT flip-flop 100 regardless of whether or not the logic state of the input signal changes, for example.

In particular, the stored logic state of the MIT flip-flop 100 may change according to the input signal logic state only during the clock pulse $P_{clk}$, according to some examples. The stored logic state of the MIT flip-flop 100 may be changed if the input signal, during a subsequent clock pulse $P_{clk}$, has a logic state that corresponds to another logic state of the MIT flip-flop 100. For example, the MIT flip-flop 100 that has a logic state set to the first logic state $M_1$ may be changed or set to a second logic state $M_2$ corresponding to a second logic state $S_2$ of the input signal when the input signal has the second logic state $S_2$ during the subsequent clock pulse $P_{clk}$. The clock pulse $P_{clk}$ may be provided to the MIT flip-flop 100 at a clock input port Clk illustrated in FIG. 3A.

As illustrated in FIG. 3A, the MIT flip-flop 100 comprises a metal-insulator phase transition (MIT) device 110 having current-controlled negative differential resistance (CC-NDR). The MIT device 110 is configured to provide a pair of bi-stable operating states of the MIT device, according to various examples. In some examples, the bi-stable operating states are separated from one another on a current-voltage (I-V) characteristic of the MIT device 110 by a CC-NDR region of the I-V characteristic. According to various examples, a bi-stable operating state of the pair is capable of being selected by a programing voltage. Moreover, once the bi-stable operating state is selected, the bi-stable operating state is capable of being maintained by a bias voltage applied to the MIT device 110, according to various examples. As such, the selectable bi-stable operating states may also be referred to as programmable operating states where the bi-stable operating state is selected or programmed by the programming voltage and then maintained by the bias voltage. According to various examples, the selected bi-stable operating state represents a logic state of the MIT flip-flop 100.

According to various examples, the MIT device 110 exhibits an S-shaped I-V characteristic (e.g., see FIG. 2) having a first knee (e.g., knee 22 in FIG. 2) that is above a CC-NDR region of the I-V characteristic and a second knee (e.g., knee 24 in FIG. 2) that is below the CC-NDR region. The first knee corresponds to a first threshold voltage $V_{th,1}$ (e.g., $V_{th,1}$ in FIG. 2) and the second knee corresponds to a second threshold voltage $V_{th,2}$ (e.g., $V_{th,2}$ in FIG. 2), respectively, of the S-shaped I-V characteristic, according to some examples. In some examples, a first one of the bi-stable operating states lies within a region of the I-V characteristic that is below the second knee and between the first and second threshold voltages $V_{th,1}$, $V_{th,2}$. A second one of the bi-stable operating states lies within a region of the I-V characteristic that is above the first knee and between the first and second threshold voltages $V_{th,1}$, $V_{th,2}$, in some examples. In some examples, the first bi-stable operating state (or resistance state) of the MIT device 110 may be selected by a programming voltage that is less than the first threshold voltage $V_{th,1}$. In some examples, a programming voltage that is greater than the second threshold $V_{th,2}$ may select the second bi-stable operating state of the MIT device 110.

In some examples, the MIT device 110 is a two-terminal device. In particular, the MIT device 110 may have a first terminal 112 and a second terminal 114, according to some examples. In some examples, the first terminal 112 may be configured to receive the programming voltage that establishes the selectable bi-stable operating state of the MIT device 110. In addition, the first terminal 112 may be configured to receive the bias voltage that holds or maintains the selectable resistance state of the MIT device 110. In some examples, the second terminal 114 may be connected to a ground potential (i.e., to ground).

In some examples, the two-terminal MIT device 110 may be connected to operate in voltage mode. In voltage mode, the bi-stable operating states are represented by a pair of voltages or voltage states at a terminal (e.g., the first terminal 112) or across the terminals 112, 114 of the MIT device 110. For example, FIG. 3A illustrates the MIT device 110 as a two-terminal device connected in voltage mode with the second terminal 114 connected to ground. In other examples, a value of an electric current flowing through MIT device 110 (e.g., entering terminal 112 or exiting terminal 114), is determined by the bi-stable operating state of the MIT device 110 and represents the stored logic state of the MIT flip-flop 100. For example, the MIT device 110 may be connected in series between other components of the MIT flip-flop 100. In these examples, the MIT device 110 is said to be connected to operate in current mode. In particular, in current mode the pair of bi-stable operating states are represented by a pair of current states of the electric current that flows through the series-connected MIT device 110. FIG. 3B illustrates the MIT device 110 as a two-terminal device connected in series to operate in current mode, for example.

In some examples, the MIT device 110 comprises a first electrode, a second electrode, and a metal-insulator phase transition (MIT) material between the first and second electrodes. The MIT device 110 may be substantially similar to the MIT device 10 illustrated in FIG. 1, for example. In particular, the metal-insulator phase transition material may be in contact with the electrodes, in some examples. In other examples, another conductive material layer may be inserted between the metal-insulator phase transition material and one or both of the electrodes. The other conductive material layer may comprise one or both of a conductor and a semiconductor, according to some examples.

Referring again to the example illustrated in FIGS. 3A and 3B, the MIT flip-flop 100 may further comprise a driver 120. The driver 120 is configured to provide the programming signal to establish the bi-stable operating state and to further set the logic state of the MIT flip-flop 100. The driver 120 is also configured to provide the bias voltage to maintain the established selectable resistance and to hold the logic state of the MIT flip-flop 100.

In some examples (e.g., as illustrated in FIGS. 3A and 3B), the driver 120 comprises a multiplexer 120 having a plurality of inputs. The multiplexer 120 is configured to select between a data input D of the MIT flip-flop 100 and the bias voltage $V_{bias}$ connected to separate ones of the plurality of inputs. The data input may provide a voltage comprising the programing voltage, according to various examples. In some examples, the multiplexer 120 may be a logic circuit that acts to select between the data input D and a voltage source that provides the bias voltage $V_{bias}$. In some examples, the multiplexer 120 or equivalently the driver 120 comprises a switch and a bias resistor (not illustrated in FIGS. 3A and 3B). In some examples, the switch is configured to provide the programming voltage (e.g., as a voltage signal) present at an input port D of the MIT flip-flop 100 to the MIT device 110 when the switch is ON. In some examples, the bias resistor is configured to provide the bias voltage to the MIT device 110 when the switch is OFF.

For example, the switch may be configured in a first switch position (e.g., ON) to provide a connection between the input port D of the MIT flip-flop 100 and the MIT device 110. When the switch is in the first position (ON), the voltage signal from the input port D may be communicated to the first terminal 112 of the MIT device 110 through the switch, for example. In some examples, the switch may be configured to have a second switch position when the switch is OFF. The second switch position may provide a connection between the bias resistor and the MIT device 110. For example, when the switch is in the second position (OFF), the bias voltage produced at an output of the bias resistor may be communicated to the first terminal 112 of the MIT device 110.

In some examples, the switch is a single pole, double throw (SPDT) switch having the first switch position (ON) and the second switch position (OFF). A first circuit formed by the first switch position of the SPDT switch forms the connection between the input port D of the MIT flip-flop 100 and the MIT device 110 while a second circuit formed by the second switch position of the SPDT switch connects the bias resistor to the MIT device 100.

In other examples, another type of switch may be used. For example, the switch may be a single pole single throw (SPST) switch connected between the input port D of the MIT flip-flop 100 and the first terminal 112 of the MIT device 110. The bias resistor may also be connected to the first terminal 112 of the MIT device 110. When the SPST switch is ON (i.e., the SPST switch is closed), the programming voltage appearing at the input port D of the MIT flip-flop 100 is communicated to the first terminal 112 of the MIT device 110. When the SPST switch is OFF (i.e., the SPST switch is open), the connection to the input port D is broken and only the bias resistor is connected to the MIT device 110.

In some examples, the MIT flip-flop 100 further comprises an output driver 130. The output driver 130 is configured to communicate a selected bi-stable operating state of the MIT device 110 to an output port Q of the MIT flip-flop 100. For example, the output driver 130 may be configured to communicate a voltage at the first terminal 112 of the MIT device 110 to the output port Q of the MIT flip-flop 100 (e.g., when the MIT device 110 is connected to operate in voltage mode), as illustrated in FIG. 3A. In other examples, the state of the MIT device 110 comprises another attribute (e.g., a current or a resistance) and the output driver 130 communicates the attribute or a representation thereof to the output port Q of the MIT flip-flop 100. In particular, when the MIT device 110 is connected to operate in current mode, as illustrated in FIG. 3B, the output driver 130 may comprise a current mode driver 130. The current mode driver 130 is a circuit that is configured to convert the current state that represents the bi-stable operating state of the MIT device 110 into a voltage at an output of the MIT flip-flop 100, according to some examples.

For example, the current mode driver 130 may be a current feedback or transimpedance amplifier comprising an operational amplifier and a feedback resistor $R_f$ connected from an output of the operational amplifier to a negative (e.g., '−') input of the operational amplifier. An input resistance $R_{in}$ of the transimpedance amplifier may be provided by the MIT device 110, for example. In another example, the current mode driver 130 of FIG. 3B may comprise a current feedback operational amplifier.

In some examples, the output driver 130 (e.g., either voltage mode or current mode) may introduce a time delay in the voltage or in another attribute that is communicated to the output port Q of the MIT flip-flop 100. The time delay may allow for switching between establishing the bi-stable operating state of the MIT device 110 during programming and maintaining the bi-stable operating state once established, for example. In some examples, the output driver 130 comprises a delay circuit to introduce the time delay. The delay circuit may include a capacitor, charging and discharging of which provides the delay, for example.

Figure 4:
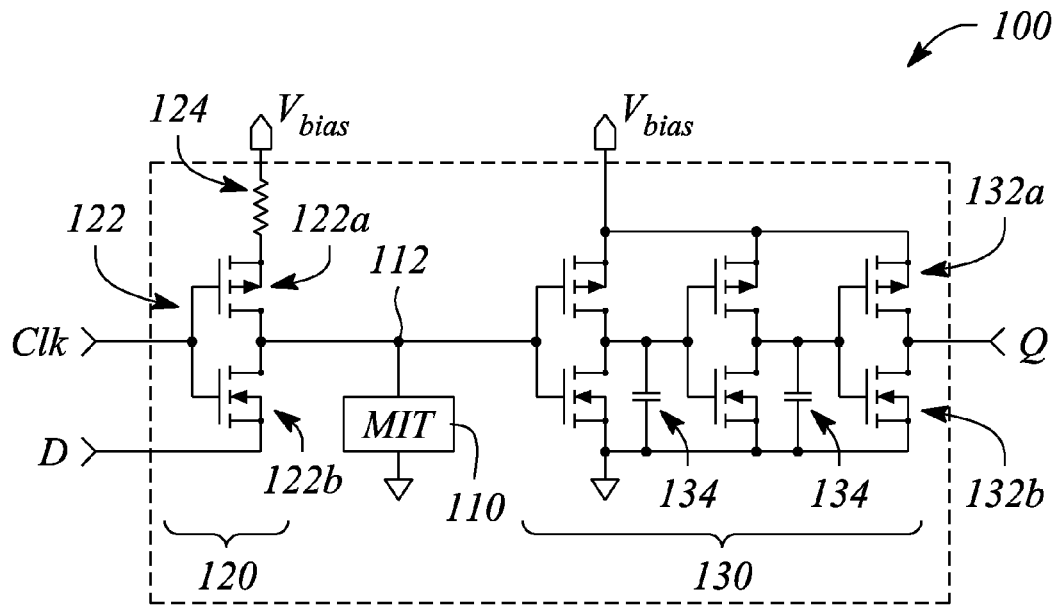
FIG. 4 illustrates a schematic diagram of a metal-insulator phase transition (MIT) flip-flop, according to an example of the principles described herein.

FIG. 4 illustrates a schematic diagram of an MIT flip-flop 100, according to an example of the principles described herein. In particular as illustrated, the MIT flip-flop 100 comprises the MIT device 110 connected between an example of the input driver 120 and an example of the output driver 130. The input driver 120 illustrated in FIG. 4 comprises a switch 122 and a bias resistor 124. The switch 122 is a complimentary metal-oxide semiconductor (CMOS) 2PDT switch comprising a p-type metal-oxide-semiconductor (PMOS) transistor 122a and an n-type metal-oxide semiconductor (NMOS) transistor 122b. The PMOS transistor 122a has a source connected to the first terminal 112 of the MIT device 110 and a drain connected to the bias resistor 124. The NMOS transistor 122b has a drain connected to the source of the PMOS transistor 122a and a source connected to the input port D of the MIT flip-flop 100. A gate of the NMOS transistor 122b is connected to a gate of the PMOS transistor 122a. In FIG. 4, the MIT device 110 is connected in voltage mode, for example.

As illustrated in FIG. 4, the switch 122 may be turned ON by application of a clock pulse $P_{clk}$ to the connected gates of the transistors 122a, 122b. The clock pulse may be applied by a clock input port Clk of the MIT flip-flop 100, for example. In particular, the switch 122 may be ON by application of a positive voltage (e.g., the clock pulse) to the connected gates that turns on the NMOS transistor 122b and turns off the PMOS transistor 122a. For example, the NMOS transistor 122b may be turned on (e.g., operated in a saturation mode) by an applied voltage at the connected gates, wherein the applied voltage provides a gate-to-source voltage $V_{gs}$ of the NMOS transistor 122b that exceeds a threshold voltage $V_{th}$ of the NMOS transistor 122b (e.g., $V_{gs,NMOS} > V_{th,NMOS}$). At the same time, the applied voltage that turns on the NMOS transistor 122b will ensure that the PMOS transistor 122a is turned off (e.g., operating in pinch-off) since such an applied voltage will produce a gate-to-source voltage $V_{gs}$ of the PMOS transistor that is greater than zero volts ($V_{gs,PMOS} > 0$ V). When the NMOS transistor 122b is turned on, the input port D voltage signal is electrically connected and communicated through the NMOS transistor 122b to the MIT device 110.

Alternatively, the switch 122 may be turned OFF in the absence of the positive voltage at the connected gates. In particular, in the absence of the positive voltage (e.g., the clock pulse), the PMOS transistor 122b is turned on and the NMOS transistor 122b is turned off. For example, the $V_{gs}$ of the NMOS transistor 122b may be less than or equal to zero voltage ($V_{gs,PMOS} \leq 0$ V) to pinch-off the NMOS transistor 122b in the absence of the applied positive voltage. At the same time, the absence of the positive voltage at the connected gates may produce a $V_{gs}$ of the PMOS transistor 122a that is more negative than a threshold voltage $V_{th}$ of the PMOS transistor 122a ($V_{gs,PMOS} < V_{th}$), which places the PMOS transistor 122a in saturation mode. When the PMOS transistor 122a is on, the bias resistor is electrically connected to the first terminal 112 of the MIT device 110, as illustrated. When electrically connected, the voltage bias $V_{bias}$ provided by the bias resistor is applied to the first terminal 112 of the MIT device 110 through the PMOS transistor 122a. In other examples (not illustrated), another switch circuit instead of the CMOS SPDT switch 122 illustrated in FIG. 4 may be employed including, but not limited to, a switch circuit that employs a negative voltage as the clock pulse $P_{clk}$ and a switch circuit that uses complimentary clock signals (e.g., a CMOS transmission gate).

The bias resistor 124 may be further connected to a bias source to provide the bias voltage $V_{bias}$, at the MIT device 110. The bias source (not illustrated) may provide a current that produces the bias voltage $V_{bias}$ provided by the bias resistor 124, for example. The bias voltage and thus a resistance of the bias resistor 124 along with a characteristics of the bias source are chosen to provide a bias voltage $V_{bias}$ that is between the first and second threshold voltages $V_{th,1}$, $V_{th,2}$ of the MIT device, according to various examples. For example, the bias resistor 124 may have a resistance that is chosen to provide a load line substantially similar to the load line illustrated in FIG. 2.

FIG. 4 further illustrates the output driver 130 compatible with the voltage mode connection of the MIT device 110. As illustrated, the output driver 130 comprises a plurality of PMOS transistors 132a and a plurality of NMOS transistors 132b. The PMOS and NMOS transistors 132a, 132b of the respective pluralities are connected as a three-stage, inverting CMOS buffer circuit, by way of example and not limitation. The three-stage, inverting CMOS buffer circuit inverts a voltage present at the first terminal 112 of the MIT device 110 and provides sufficient current to drive another device (e.g., another MIT flip-flop), for example. As illustrated, the output driver 130 further comprises a capacitor 134 between stages of the CMOS buffer circuit. The capacitor 134 may have a capacitance of about 4 picofarads (pF), for example. The capacitor 134, in conjunction with an impedance of a preceding stage of the CMOS buffer circuit, delays propagation of a voltage on the MIT device 110 to the output port Q of the MIT flip-flop 100.

Figure 5:
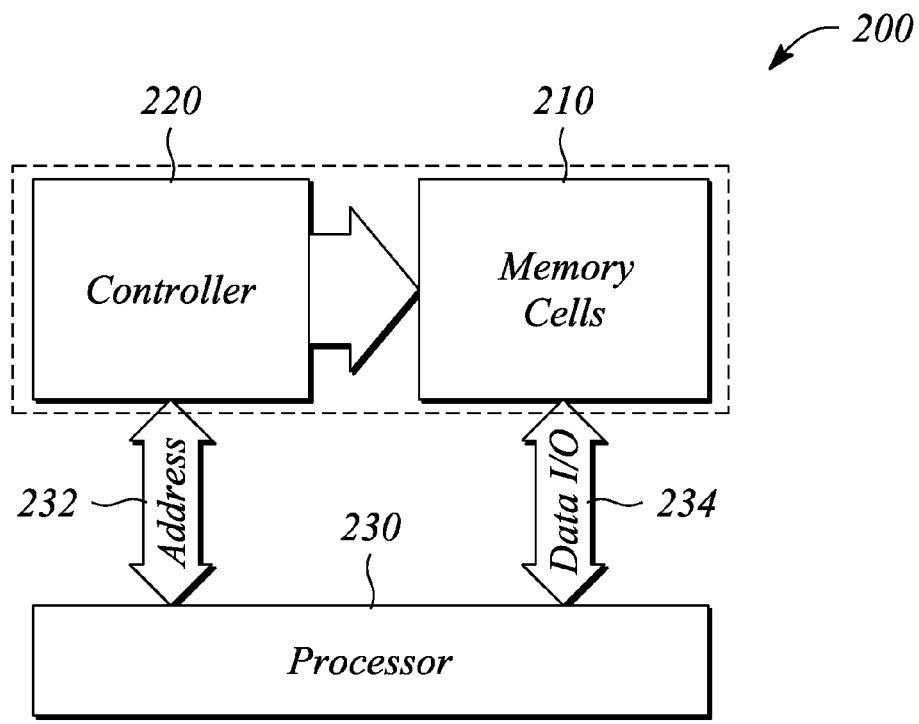
FIG. 5 illustrates a block diagram of a shiftable memory that employs a metal-insulator phase transition (MIT) flip-flop, according to an example of the principles described herein.

FIG. 5 illustrates a block diagram of a shiftable memory 200, according to an example of the principles described herein. The shiftable memory 200 comprises a plurality of memory cells 210 arranged adjacent to one another in an array. The memory cells 210 are configured to store one or more data bits corresponding to a data word. According to various examples, a memory cell 210 of the plurality comprises one or more of the metal-insulator phase transition (MIT) flip-flops to store the one or more data bits of the data word. In some examples, the MIT flip-flop of the memory cell 210 is substantially similar to the MIT flip-flop 100, described above.

In particular, the MIT flip-flop of the memory cell 210 may comprise an MIT device configured to exhibit a current-controlled negative differential resistance (CC-NDR) associated with a metal-insulator phase transition of the MIT device under electrical (e.g., voltage) bias, according to various examples. In addition, the MIT device of the MIT flip-flop is configured to provide a pair of operating states of the MIT device that are selectable and bi-stable. A particular state of the selectable operating states is capable of being established by a programming voltage applied to the MIT device. Once established, the selectable operating state is further capable of being maintained by a bias voltage provided to the MIT device. The established selectable operating state represents a logic state (e.g., symbolized as a logic '1' or a logic '0') of the MIT flip-flop and by extension a value of a bit or bits stored as a data word by the memory cell 210.

In some examples, the MIT device is substantially similar to the MIT device 110 described above with respect to the MIT flip-flop 100. In particular, in some examples, the MIT device is connected to operate in voltage mode while in other examples the MIT device is connected to operate in current mode. Further, according to some examples, a first operating state of the pair of operating states may be selected by a first programming voltage and a second operating state of the pair may be selected by a second programming voltage. According to some examples, one or both of the programming voltage and the bias voltage are provided by an input driver. In some examples, the input driver is substantially similar to the driver 120 described above with respect to the MIT flip-flop 100.

Further, as illustrated in FIG. 5, the shiftable memory 200 further comprises a controller 220 to select and to shift a contiguous subset of data words within the array of memory cells. The contiguous subset has a length that is less than a total length of the array. Further, a shift may represent one of either an upshift or a downshift and includes only the contiguous subset of data words within the array selected by the controller 220.

According to various examples, the shiftable memory 200 provides shifting of the contiguous subset of data words stored in the shiftable memory 200. Further, shifting of data words by the shiftable memory 200 shifts only the data words in the contiguous subset and not other stored data words. In particular, when the shiftable memory 200 performs a shift of the contiguous subset, the shift does not shift other stored data words located outside of the contiguous subset. Further, the shift moves the contiguous subset of stored data words without changing or otherwise affecting an order of the stored data words in the contiguous subset, according to some examples. The shift provided by the shiftable memory 200 may be used to one or both of insert new data words into the shiftable memory 200 and delete data words stored therein, for example.

An external resource (e.g., a processor 230) may communicate data to and from the shiftable memory 200 via a data bus (Data I/O) 234, according to some examples. An address and a length of the contiguous subset may be communicated to the shiftable memory 200 using an address bus (Address) 232, for example. An address bus that carries both the address and the length or alternatively a pair of addresses may be employed, according to various examples.

Figure 6:
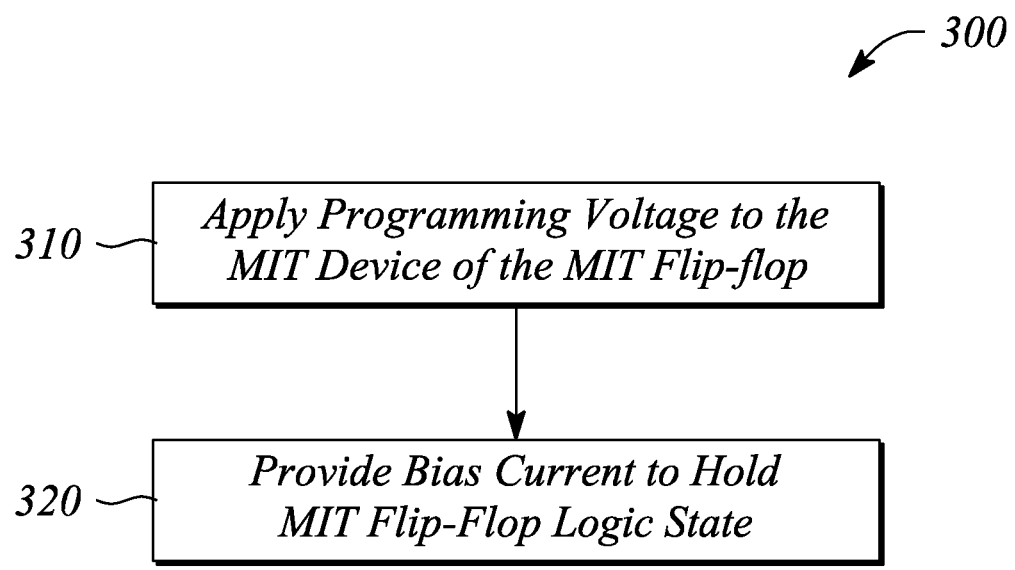
FIG. 6 illustrates a flow chart of a method of setting and holding a logic state of a metal-insulator phase transition (MIT) flip-flop, according to an example of the principles described herein.

FIG. 6 illustrates a flow chart of a method 300 of setting and holding a logic state of a metal-insulator phase transition (MIT) flip-flop, according to an example of the principles described herein. The method 300 of setting and holding a logic state in an MIT flip-flop comprises applying 310 a programming voltage to a metal-insulator phase transition (MIT) device of the MIT flip-flop. The applied programming voltage is configured to select between a pair of bi-stable operating states of the MIT device that represent logic states of the MIT flip-flop. According to various examples, the MIT device has a current-controlled negative differential resistance (CC-NDR) and is configured to provide the bi-stable operating states of the MIT device.

In particular, according to some examples, the programming voltage is configured to set the logic state of the MIT flip-flop by selecting or equivalently programming the bi-stable operating state of the MIT device. In some examples, when the applied 310 programming voltage is below a first threshold $V_{th,1}$, a first bi-stable operating state of the pair is selected. Alternatively, when the applied 310 programming voltage is above a second threshold $V_{th,2}$, a second bi-stable operating state is selected, in some examples. In some examples, the first threshold $V_{th,1}$ is substantially similar to the first threshold $V_{th,1}$ illustrated in FIG. 2. The second threshold $V_{th,2}$ may be substantially similar to the second threshold $V_{th,2}$ illustrated in FIG. 2, according to some examples. In some examples, the MIT flip-flop and the MIT device are substantially similar to the MIT flip-flop 100 and MIT device 110 described above.

Further, as illustrated in FIG. 6, the method 300 of setting and holding a logic state of an MIT flip-flop further comprises providing 320 a bias voltage to the MIT device to hold the MIT flip-flop logic state. The bias voltage holds the selected bi-stable operating state in the absence of the programming voltage, for example.

In some examples (not illustrated), the method 300 of setting and holding a logic state of an MIT flip-flop further comprises providing the programming voltage during a first time period to be applied 310 to the MIT device from an input port of the MIT flip-flop. The first time period corresponds to a time period when the programming voltage is being applied 310. A switch connected between the input port and the MIT device, for example, may provide the programming voltage. In another example, the programming voltage may be provided by a multiplexer.

In some examples (not illustrated), the method 300 of setting and holding a logic state of an MIT flip-flop further comprises communicating a signal representing a selected bi-stable operating state of the MIT device to an output port of the MIT flip-flop. The communicated signal may represent the logic state of the MIT flip-flop, for example. In some examples, the signal may represent a voltage of the MIT device (e.g., when operated in voltage mode). In other examples, the signal may represent a current flowing through the MIT device (e.g., when operated in current mode). The signal may be communicated using an output driver, for example. The output driver may be substantially similar to the output driver 130 described above. In particular, the output driver may comprise a time delay circuit (e.g., a capacitive delay) to delay communication of the voltage, according to some examples.

Thus, there have been described examples of a metal-insulator phase transition flip-flop and a method of setting and holding a logic state of a metal-insulator phase transition flip-flop that employ a metal-insulator phase transition having CC-NDR to store data. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A metal-insulator phase transition (MIT) flip-flop comprising:
    a metal-insulator phase transition (MIT) device having current-controlled negative differential resistance (CC-NDR) to provide a pair of bi-stable operating states, the bi-stable operating states being separated from one another on a current-voltage (I-V) characteristic of the MIT device by a CC-NDR region of the I-V characteristic,
    wherein a bi-stable operating state of the pair is capable of being selected by a programing voltage, and wherein once the bi-stable operating state is selected, the bi-stable operating state is maintained by a bias voltage that is applied to the MIT device during a time that the bi-stable operating state remains unchanged, the selected bi-stable operating state representing a logic state of the MIT flip-flop.

2. The metal-insulator phase transition (MIT) flip-flop of claim 1, further comprising a multiplexer to select between a data input of the MIT flip-flop and a bias voltage source, the data input providing a voltage comprising the programing voltage.

3. The metal-insulator phase transition (MIT) flip-flop of claim 2, wherein the multiplexer comprises a switch and a bias resistor, the switch to connect the MIT device to the data input when the switch is ON, the bias resistor to provide the bias voltage to the MIT device when the switch is OFF.

4. The metal-insulator phase transition (MIT) flip-flop of claim 1, wherein the MIT device is connected to operate in a voltage mode, the pair of bi-stable operating states being represented by a pair of voltage states at a terminal of the MIT device.

5. The metal-insulator phase transition (MIT) flip-flop of claim 1, further comprising an output driver to communicate a voltage state at the MIT device terminal to an output of the MIT flip-flop, the output driver having a delay circuit to introduce a time delay in communicating the voltage state.

6. The metal-insulator phase transition (MIT) flip-flop of claim 1, wherein the MIT device is connected in series to operate in current mode, the pair of bi-stable operating states being represented by a pair of current states of an electric current that flows through the series-connected MIT device.

7. The metal-insulator phase transition (MIT) flip-flop of claim 6, further comprising a current mode driver to convert a current state of the pair of current states into a voltage at an output of the MIT flip-flop.

8. The metal-insulator phase transition (MIT) flip-flop of claim 1, wherein the MIT device comprises:
a first electrode;
a second electrode; and
a metal-insulator phase transition material between the first electrode and the second electrode,
wherein the first electrode and the second electrode serve as terminals of the MIT device.

9. The metal-insulator phase transition (MIT) flip-flop of claim 8, wherein the metal-insulator phase transition material comprises an oxide of one of niobium, titanium and vanadium to undergo the metal-insulator phase transition, and wherein one or both of the first electrode and the second electrode comprise one or more of gold, silver, platinum, tungsten, copper, titanium, tantalum.

10. A metal-insulator phase transition (MIT) flip-flop comprising:
a first electrode and a second electrode;
a metal-insulator transition (MIT) material connected between the first and second electrodes and having current-controlled negative differential resistance (CC-NDR) when under electrical bias, the MIT material between the electrodes to exhibit a pair of operating states of the MIT flip-flop that are bi-stable; and
an input driver to select one of the operating states in response to a programming voltage and to provide a bias voltage to maintain the selected operating state where the bias voltage is applied throughout a time that the selected operating state is maintained, a first operating state of the pair being selected by a first programming voltage and a second operating state of the pair being selected by a second programming voltage,
wherein the selected operating state represents a logic state of the MIT flip-flop.

11. The metal-insulator phase transition (MIT) flip-flop of claim 10, wherein the input driver comprises a multiplexer to select between a data input of the MIT flip-flop and the bias voltage, the data input comprising one of the first programming voltage and the second programming voltage.

12. The metal-insulator phase transition (MIT) flip-flop of claim 10, further comprising an output driver to communicate the selected operating state to an output of the MIT flip-flop, the output driver communicating an indication of a voltage at the first electrode when the first and second electrodes and the MIT material are connected for voltage mode operation, the output driver communicating an indication of a current flowing between the first and second electrodes and through the MIT material when the first and second electrodes and MIT material are connected for current mode operation.

13. A shiftable memory employing the metal-insulator phase transition (MIT) flip-flop of claim 10, the shiftable memory comprising:
a plurality of memory cells arranged adjacent to one another in an array, a memory cell of the plurality to store one or more data bits corresponding to a data word, the memory cell comprising one or more of the MIT flip-flops to store the one or more data bits of the data word; and
a controller to select and to shift a contiguous subset of data words within the array, the contiguous subset having a length that is less than a total length of the array, a shift representing either an upshift or a downshift of only the contiguous subset of data words within the array selected by the controller.

14. A method of setting and holding a logic state of a metal-insulator phase transition (MIT) flip-flop, the method comprising:
applying a programming voltage to a metal-insulator phase transition (MIT) device to select between a pair of bi-stable operating states of the MIT device that represent logic states of the MIT flip-flop, the MIT device having a current-controlled negative differential resistance (CC-NDR) that provides the pair of bi-stable operating states; and
providing a bias voltage to the MIT device to hold the selected bi-stable operating state in the absence of the programming voltage, the bias voltage being applied throughout a time that the selected bi-stable operating state is maintained in the MIT device,
wherein the programming voltage being below a first threshold selects a first bi-stable operating state of the pair, and wherein the programming voltage being above a second threshold selects a second bi-stable operating state of the pair.

15. The method of setting and holding a logic state of an MIT flip-flop of claim 14, further comprising:
providing the programming voltage to the MIT device from an input port of the MIT flip-flop during a first time period, the first time period corresponding to a time period when the programming voltage is applied; and
communicating a signal representing the selected bi-stable operating state of the MIT device to an output port of the MIT flip-flop,
wherein the communicated signal is the logic state of the MIT flip-flop.

16. The metal-insulator phase transition (MIT) flip-flop of claim 8, wherein at least one of the electrodes comprises two layers of different material.

17. The metal-insulator phase transition (MIT) flip-flop of claim 16, wherein at least one of the electrodes comprises a first layer of titanium and a second layer comprising platinum, the first layer being between the MIT device and the second layer.

18. The metal-insulator phase transition (MIT) flip-flop of claim 8, wherein a material of the electrodes acts as a diffusion barrier.

19. The metal-insulator phase transition (MIT) flip-flop of claim 8, wherein the MIT device comprises a metal-oxide and the electrodes comprise a same metal as is in the metal-oxide.

20. The metal-insulator phase transition (MIT) flip-flop of claim 1, further comprising an output driver, comprising an amplifier, to output an indication of a state of the flip-flop.

* * * * *